United States Patent [19]

Leveque

[11] Patent Number: 5,198,793
[45] Date of Patent: Mar. 30, 1993

[54] ELECTRIC CONTROL APPARATUS COMPRISING INTEGRAL ELECTRICAL CONDUCTORS PLATED ON A TWO-SHOT MOLDED PLASTIC INSULATING HOUSING

[75] Inventor: Denis J. Leveque, Milwaukee, Wis.
[73] Assignee: Eaton Corporation, Cleveland, Ohio
[21] Appl. No.: 737,857
[22] Filed: Jul. 30, 1991
[51] Int. Cl.⁵ ........................................... H01C 10/30
[52] U.S. Cl. .................................... 338/172; 200/537; 200/547; 200/522; 338/167; 338/170; 338/184
[58] Field of Search ............... 338/172, 198, 191, 167, 338/170, 199, 184; 200/547, 50 C, 522, 537, 303, 305; 318/17, 774, 786, 793, 289

[56] References Cited

U.S. PATENT DOCUMENTS

| | | | |
|---|---|---|---|
| 3,713,070 | 1/1973 | Sahrbacker | 338/198 |
| 3,769,480 | 10/1973 | Lee | 200/50 C |
| 3,842,328 | 10/1974 | Supel et al. | 338/198 X |
| 4,137,490 | 1/1979 | Brozoski et al. | 338/198 X |
| 4,205,434 | 6/1980 | Brozoski et al. | 338/198 X |
| 4,241,298 | 12/1980 | Trammell, Jr. et al. | 318/17 |
| 4,665,290 | 5/1987 | Piber | 200/303 |
| 4,772,768 | 9/1988 | Nukada | 200/305 |
| 4,812,275 | 3/1989 | Yumoto | 264/129 |
| 4,944,908 | 7/1990 | Leveque et al. | 264/232 |
| 5,075,604 | 12/1991 | Crook et al. | 318/17 |

Primary Examiner—Marvin M. Lateef
Attorney, Agent, or Firm—L. G. Vande Zande

[57] ABSTRACT

A trigger operated speed control wherein the insulating housing is a two-shot molding having metal conductors plated on one of the molding materials on various external and interior surfaces. Stationary contact elements are secured to respective plated conductors within a housing cavity, as are terminals of the FET on an external surface of the housing. A printed circuit board is secured to the housing over an open side thereof to close the housing cavity, retaining all movable parts of the control within the cavity, the board having plated through holes which receive and are soldered to plated pin projections of the housing to secure the board to the housing and complete selected conducting paths between plated conductors and printed circuit traces. A plated molded pin projection also receives a pin receptacle terminal of a separate reversing switch unit when positioned in a pocket formed in the housing.

34 Claims, 4 Drawing Sheets

ELECTRIC CONTROL APPARATUS COMPRISING INTEGRAL ELECTRICAL CONDUCTORS PLATED ON A TWO-SHOT MOLDED PLASTIC INSULATING HOUSING

BACKGROUND OF THE INVENTION

This invention relates to electric control apparatus wherein conductive elements of the apparatus are plated directly on an insulating housing. More specifically, the invention relates to electric control apparatus for controlling portable electric tools, such apparatus having a trigger operator which is adapted to be operated by the index finger of the user's hand which holds the tool. More specifically, the invention relates to switches of the aforementioned type which control the speed of the motor as a function of depression of the trigger.

Switches of the aforementioned type incorporate a large number of operational functions within a package made sufficiently small to fit within the handle of a portable electric tool. The operational functions include switching on and switching off of the control, reversing, lock-on and lock-off of the control and may include other functions such as indication and full connections to portable power sources or battery charging equipment. Size constraints for such controllers have resulted in compact, but complex devices having numerous parts and several subassembly components. A trigger operated electric tool switch of the aforementioned type is disclosed and claimed in U.S. Pat. No. 4,665,290, to Earl T. Piber, assigned to the assignee of this application, the disclosure of which is incorporated herein by reference.

Molded articles having electric conductors embedded in adjourning, non-coplanar surfaces and electrically continuous between such surfaces are known. U.S. Pat. No. 4,944,908 issued to Denis J. Leveque and Neil A. Czarnecki and owned by the assignee of this invention discloses a method for forming a molded plastic article as described above wherein a metalized printed circuit is printed on a temporary flexible backing sheet which is positioned in a mold cavity with the metal side exposed. Injected plastic surrounds three sides of the metal trace to create an embedded conductor which is exposed in the final article when the backing is peeled off. This method is not well suited for forming articles having complex structural features and does not address conductors which are routed through a wall of the article from one surface to an opposite surface.

It is also known to produce molded articles with plated metal traces for electrically conductive paths such as is discussed in U.S. Pat. No. 4,812,275 issued to Tetsuo Yamoto, the disclosure of which is incorporated herein by reference. This patent discloses one of several two-step molding processes, also known as two-color and two-shot molding, wherein a first molded article is surface roughened and/or treated with a catalyst to promote electroless metal plating, and a molding is performed around the original article, producing the final version article with portions of the first article which are to be plated being exposed. In such process, holes may be provided through the first article to provide plated through holes in the final article and plates surfaces on opposite sides of an article wall. This invention utilizes a two-shot molding/plating technology.

SUMMARY OF THE INVENTION

The electric control apparatus of this invention incorporates plated electrical conductors as an integral part of the insulating housing for the control, thereby reducing the number of distinct parts, assembly and subassembly steps in manufacture of the control. The conductors are plated directly on the insulating housing and are electrically continuous over surfaces of the housing that intersect with each other.

Moreover, the conductors extend to external surfaces of the housing where necessary for electric termination and interconnection with other components. A printed circuit board may be secured to the housing as a cover for an open side of the housing, the printed circuit being electrically joined to the plated conductors of the housing upon such securement.

In the embodiment of a trigger operated portable electric tool control, the housing with plated conductors reduces the number of discrete parts and subassemblies for the control approximately 50%. Additionally, the overall assembly of the control is significantly simplified. The housing provides a pocket for receiving a reversing switch module, the pocket containing a plated conductor having a projecting plated pin which makes plug-in connection with the reversing switch. The printed circuit board which heretofore has been a discrete component of the switch positioned within the housing now forms a part of the housing and has a pin connector which also plugs into a terminal of the reversing switch module on assembly. Other plated pins project from the housing to be received in plated through holes of the printed circuit board whereby a multiple soldering operation bonds the plated pins within the plated through holes, at the same time securing the printed circuit board to the housing. The advantages of a control apparatus having an insulating housing with electrical conductors plated thereon, particularly in a trigger operated control for a portable electric tool, will be more fully understood and appreciated from the following description and claims when read in conjunction with the accompanying drawings.

DETAILED DESCRIPTION OF THE PREFERRED EMBODIMENTS

Figure 1:
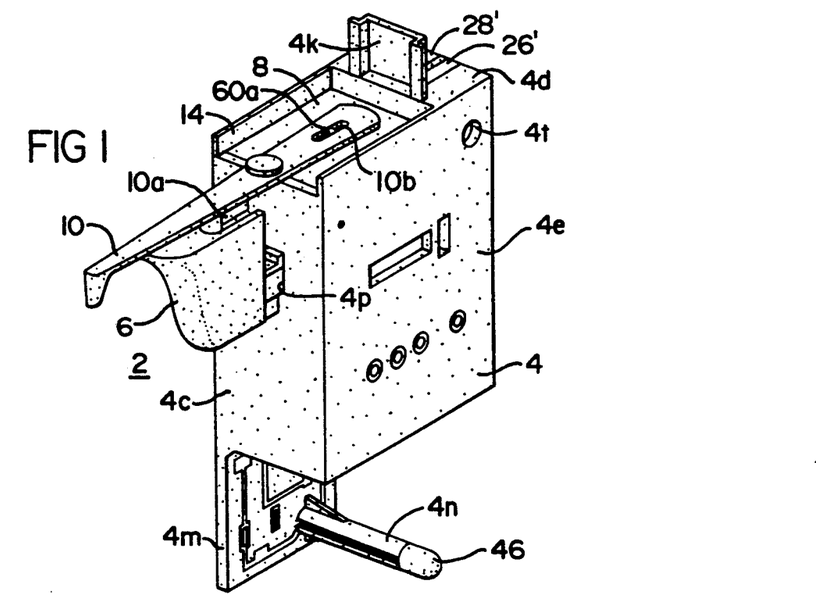
FIG. 1 is a perspective view of a trigger operated electrical control apparatus constructed in accordance with this invention.
Figure 2:
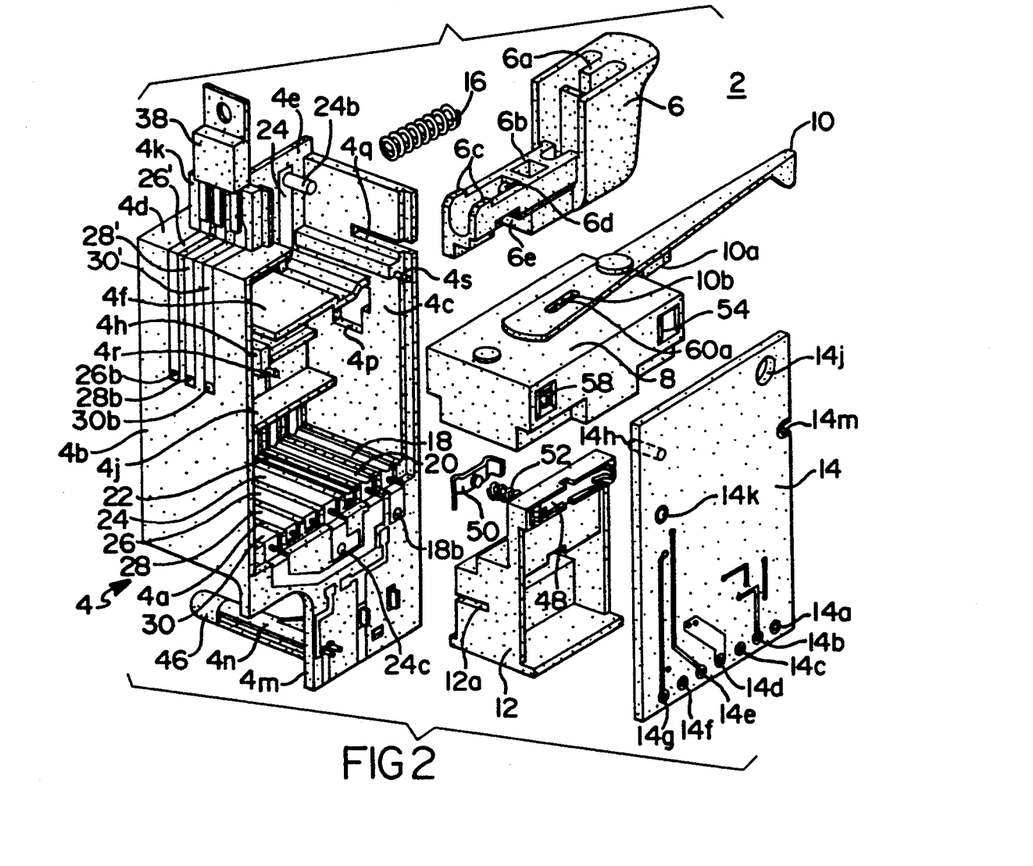
FIG. 2 is an exploded perspective view of the trigger operated electrical control apparatus shown in FIG. 1.

The electric control apparatus 2 of this invention is shown embodied in a trigger operated control for a portable electric tool or the like in an assembled view in FIG. 1 and an exploded view in FIG. 2 of the drawings. The control apparatus 2 comprises a molded insulating housing 4 having a trigger operator 6 slidably mounted thereto for linear reciprocal movement, a reversing switch 8 nested in the housing 4 above the trigger operator, the reversing switch 8 having a pivotable operating arm 10 projecting over trigger operator 6 and interlocked therewith in a known manner by a depending key 10a received in one or another slot formed in trigger 6 on either side of a central barrier 6a. A contact carrier 12 is disposed within a cavity of housing 4, and a printed circuit board 14 is attached to the housing 4 to close off an open side thereof.

Housing 4 incorporates several integrally molded structural features which function to retain, position and/or guide other elements of the apparatus as will be described hereinafter. The provision of such features is common practice in molded housings. However, the molded housing of this invention also incorporates a three-dimensional pattern of conductive strips plated on various surfaces of the housing, both internally and externally, the strips being electrically continuous between such contiguous intersecting surfaces. The molded housing is preferably constructed by a two-shot molding process wherein a first portion of said housing defining the conductive pattern is molded of a first plastic material and the second portion of the housing comprising the insulating part thereof is molded of a second plastic material subsequently injected around the first portion such that exposed surfaces of said first portion define the pattern of electrical conductors. It is to be understood that two-step and two-color processes are closely similar and yield essentially the same product, and are deemed equivalent for purposes of this invention. The first plastic material is provided with a catalyst which promotes subsequent electroless metal plating adhesion to such surfaces whereas the second plastic material rejects metal plating thereto. The metal plating is preferably a good electrical conductor such as copper in amounts of three to four ounces per square inch for adequate conduction of power currents.

Housing 4 is shown from various angles in FIGS. 2, 3, 4, 8 and 9. The housing is essentially a rectangular box-like member having a bottom wall 4a, side walls 4b and 4c, and a partial top wall 4d, each extending forwardly from a rear wall 4e. A stub wall 4f is spaced inwardly from each side wall 4b and 4c and is spaced downwardly from partial top wall 4d. Wall 4f has an offset latch surface 4g formed on the underside thereof. A projection 4h is disposed at right angles to the general plane of wall 4f and spaced between the left-hand end of wall 4f and side wall 4b. Projection 4h has a circular boss on the inner face thereof which serves as a spring seat for a helical compression spring 16 as will be described more fully hereinafter. A narrow guide wall 4j is disposed parallel to bottom wall 4a and wall 4f. An upstanding channel section 4k formed integrally with partial top wall 4d. A flange 4m depends from the bottom wall 4a in the plane of an open side of housing 4, the flange 4m having a pair of generally semicylindrical projections 4n cooperatively forming a support post projecting from one side of the flange beneath the lower wall 4a. Side wall 4c has an opening 4p for receiving the rectangular shaft 6a of a trigger operator 6 therethrough and has a slot 4q located above openings 4p communicating with the open side of housing 4.

Figures 3, 4, 5:
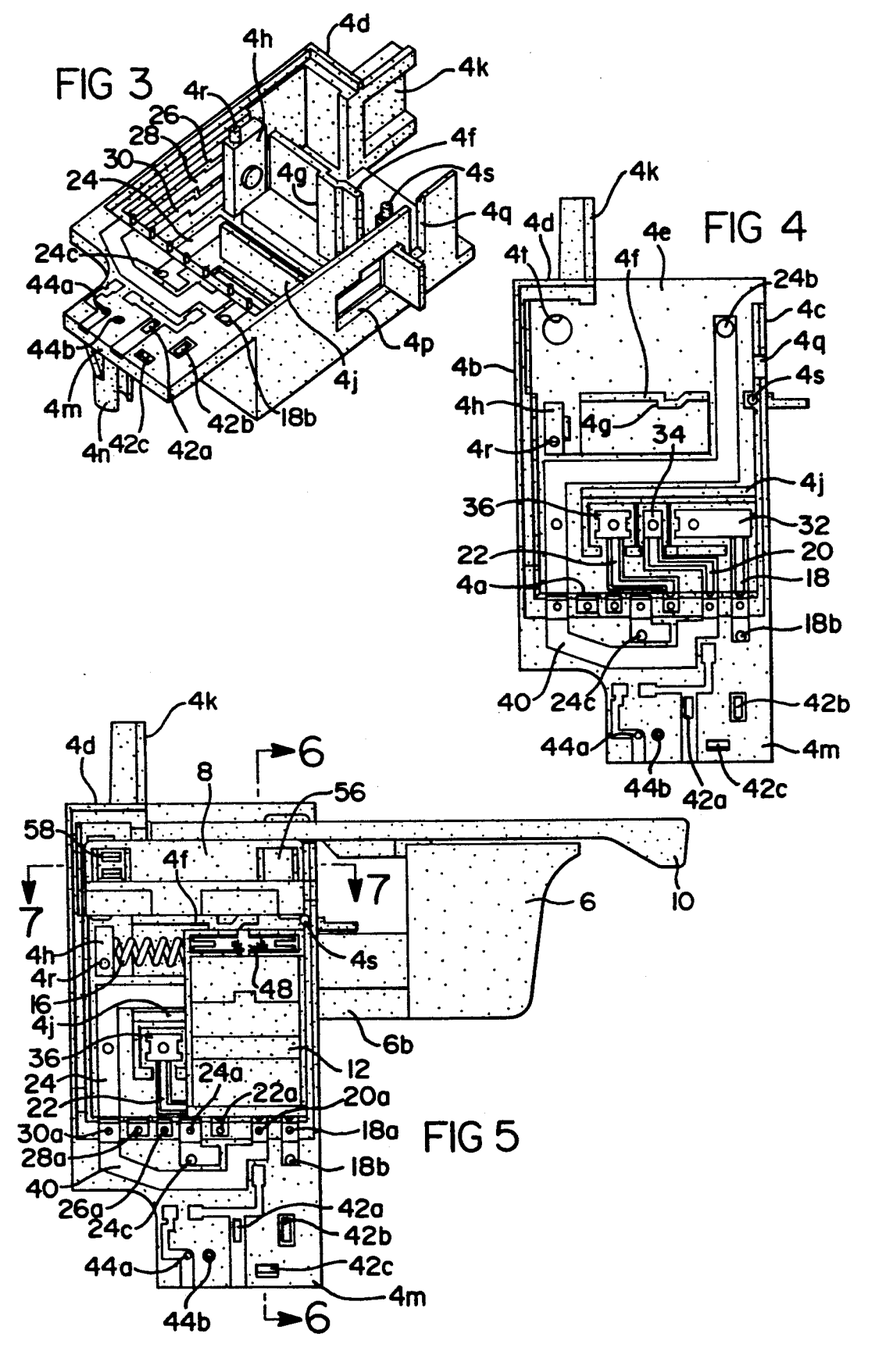
FIG. 3 is a perspective view of the housing for the control apparatus of this invention.
FIG. 4 is a front elevational view of the housing shown in FIG. 3.
FIG. 5 is a front elevational view of the trigger operated electric control apparatus of the invention with a printed circuit board cover member removed.
Figures 9, 10:
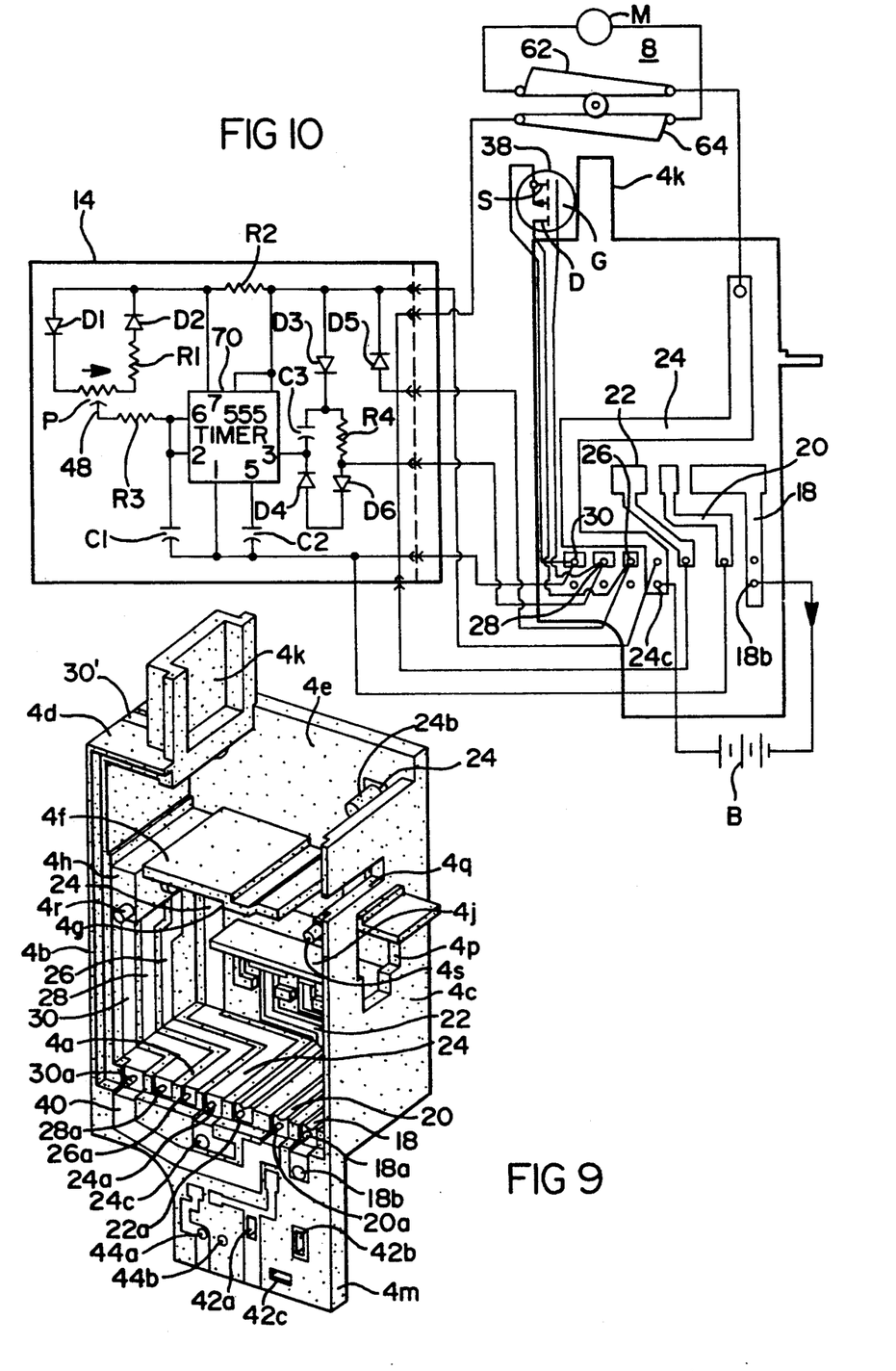
FIG. 9 is a perspective view of the housing shown in FIGS. 3, 4 and 8 taken from yet another viewing point and drawn to a slightly enlarged scale.
FIG. 10 is a schematic view of the electric control apparatus of this invention.

The conductive pattern comprises a plurality of conductive strips 18–30 disposed on the inner surface of bottom wall 4a of the housing, each of the strips extending over the adjacent edge of the housing which faces the open side thereof and having cylindrical pins 18a–30a, respectively, (FIG. 9) projecting from the open side of the housing. Conductive strips 18, 20 and 22 extend from the open side surface of housing 4 along bottom wall 4a to and up along the back wall 4e. The terminating ends of strips 18, 20 and 22 on back wall 4e have stationary contact elements 32, 34 and 36, respectively, secured thereto such as by soldering or the like. It is contemplated that the first plastic material having the plating catalyst have cylindrical bosses which extend through back wall 4e to the external surface thereof and that the stationary contact elements 32, 34 and 36 and the cylindrical bosses have aligned holes therethrough to facilitate a soldering process for attaching the stationary contacts to the conductive strips. It will also be seen that the conductive strips 18, 20 and 22 are grooved along their length to increase the transverse surface linear dimension, thereby to increase the surface area of the conductive strips to provide a specific amount of conductive metal capable of handling a predetermined power current value of 3 amps or greater. Conductive strip 24 extends inward from the open side of housing 4 along bottom wall 4a, has a right angle left turn near rear wall 4e to extend toward side wall 4b and subsequently makes a right angle right-hand turn to rear wall 4e and then upward therealong as seen in FIG. 9. Referring next to FIG. 4, conductive strip 24 extends upward on back wall 4e along side wall 4b, has a right angle bend and a lateral extension parallel to bottom wall 4a and a subsequent right angle bend and upward extension near side wall 4c. The terminating end of conductive strip 24 has a cylindrical boss 24b which projects forwardly from rear wall 4e toward the open side of housing 4, and is also plated with conductive metal. The first plastic member is also provided with a cylindrical boss through to the external surface of rear wall 4e in the plane of the similar bosses for conductive strips 18, 20 and 22 and is provided with a hole through the boss whereby the conductive metal forming strip 24 is plated through to both sides of rear wall 4e for improved bonding strength of strip 24 to the rear wall.

Referring again to FIG. 9, conductive strips 26, 28 and 30 extend along bottom wall 4a from the open side of housing 4 toward rear wall 4e. Each of these strips is provided with a left-hand right angle bend to extend to and upward along side wall 4b whereupon the strips are offset closer to rear wall 4e. The terminating end of strips 26, 28 and 30 along the inner surface of wall 4b is not illustrated in any of the views. However, referring to FIG. 2, holes are provided in side wall 4b at the upper terminating ends of conductive strips 26, 28 and 30 on the inner surface of wall 4b and these conductive strips then continue an upward direction along the exterior surface of wall 4b as conductive strips 26', 28' and 30' originating at the holes 26b, 28b and 30b, respectively. Conductive strips 26', 28' and 30' continue along upper wall 4d and then extend upwardly along the channel shaped extension 4k. The drain, gate and source electrodes of a field effect transistor (FET) 38 are soldered to the conductive strips 26′, 28′ and 30′ as seen in FIG. 2. The channel shape of extension 4k facilitates the slip-on attachment of a heat sink element (not shown) which can be then screwed or riveted into tight thermal contact with FET 38.

It can be seen that conductive strips 18 and 24 have continuing extensions along flange 4m and are each provided with a through hole 18b and 24c, respectively, which are plated through to the opposite side of the flange 4m. Holes 18b and 24c serve as input terminals for connection of the control apparatus to a power supply such as battery B shown schematically in FIG. 10. A jumper strip 40 is also provided along flange 4m interconnecting conductive strips 20 and 30. Other conductive strips may be formed on the flange 4m with plated through holes such as 42a, 42b and 42c which may receive the terminals of a plug-in jack for a battery charger or AC adapter. Another set of plated through holes 44a and 44b are provided to receive the wire leads of an LED indicator 46 positioned at the end of cylindrical projections 4n. The battery charger and LED indicator are optional functions which can change according to the requirements of the specific customer. Accordingly, the size and shape of flange 4m can readily be changed as well as the conductive pattern and any support features that are provided thereon. Housing 4 is also provided with a conductive plated pin 4r projecting from the open side face of projection 4h and a second plated pin 4s projecting from the open side of housing 4 along side wall 4c for purposes that will be explained more fully hereinafter. Referring specifically to FIGS. 1 and 4, housing 4 is also provided with a hole 4t in the upper corner below top wall 4d and in close proximity to side wall 4b.

Figure 6:
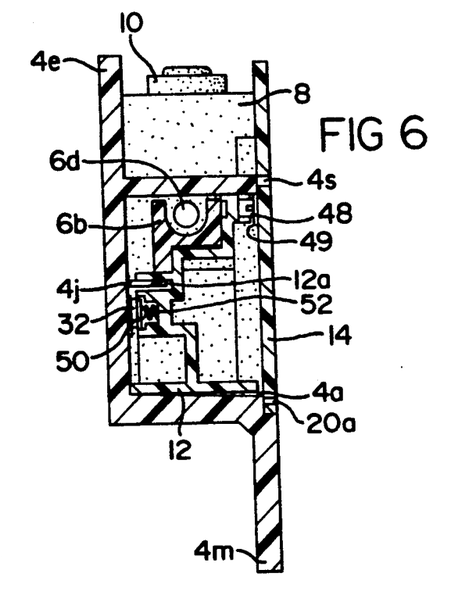
FIG. 6 is a cross sectional view through the trigger operated electric control apparatus of this invention taken along the line 6—6 in FIG. 5.

With the housing provided as described hereinabove, the trigger operated control of this invention requires the final assembly of only nine discrete parts. The shaft 6b of trigger operator 6 is inserted through opening 4p in side wall 4c of housing 4 to be disposed along the underside of wall 4f. The distal end of shaft 6b is provided with a pair of upstanding tabs 6c which ride along the under surface of wall 4f as the trigger is linearly depressed and hook against latch surface 4g to limit outward extension of trigger operator 6 with respect to the housing. Helical compression spring 16 rests in a semi-cylindrical shaped groove in the shaft 6b of trigger operator 6, the respective ends of spring 16 being positioned by a boss on projection 4h of housing 4 and a pin 6d molded integral with trigger operator 6 to bias the trigger operator to its extended or outward position with respect to housing 4. A bifurcated spring metal wiper contact element 48 is positioned within a rectangular recess in the upper portion of contact carrier 12 wherein pairs of fingers at the opposite ends of the wiper contact 48 project from the recess. A substantially U-shaped contactor 50 is positioned within a recess on the opposite side of contact carrier 12 and is biased outwardly thereof by a spring 52 (FIGS. 2 and 6). Contact carrier 12 is then inserted through the open side of housing 4 into the cavity defined by the various walls 4a–4f. Contact carrier 12 has a horizontal slot 12a which receives projecting guide 4j therein. Contactor 32 aligns with and rides on the faces of stationary contact elements 32, 34 and 36 as the trigger operator is linearly moved inward and outward of the housing 4. Although not specifically shown, movable contact carrier 12 is provided with a structural configuration along an upper surface facing rear wall 4e that is cooperatively interlocked with a complementary configuration 6e on the shaft 6b of trigger operator 6 whereby contact carrier 12 is reciprocally linearly moved by trigger operator 6.

Figure 7:
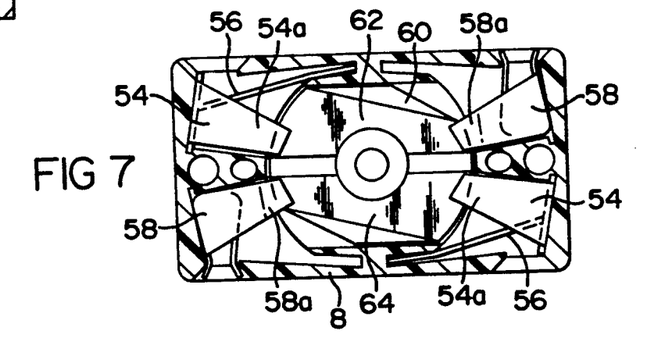
FIG. 7 is a sectional view taken through a reversing switch of the control apparatus of this invention taken along the line 7—7 in FIG. 5.
Figure 8:
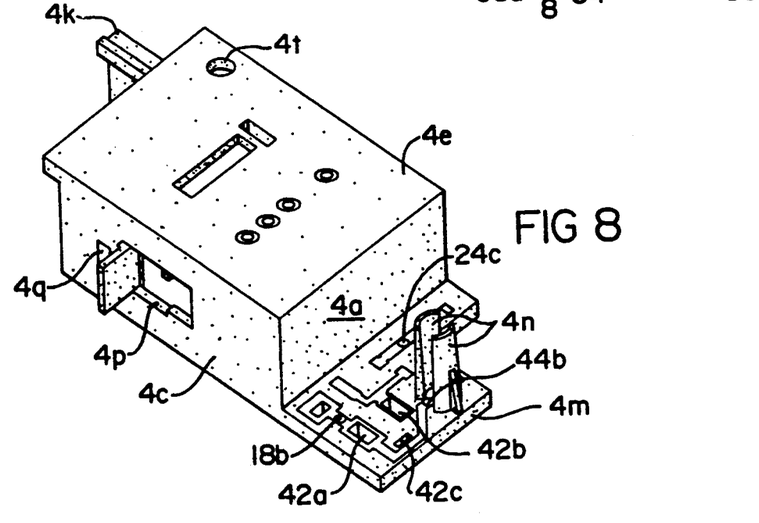
FIG. 8 is a perspective view of the housing shown in FIGS. 3 and 4 taken from a different viewing point.

Reversing switch 8 is inserted into a pocket defined by the side walls 4b, 4c and by upper wall 4d and stub wall 4f. Not specifically shown, reversing switch 8 has a projection at the forward edge thereof which is slidably received in slot 4q. Referring to FIGS. 2 and 7, reversing switch 8 has terminal openings at each of the four corners thereof, one diagonally opposite pair of openings having push-in wire lead terminals/contacts 54 having deflected spring blade wire retainers 56 bearing against a surface of the terminal/contact to trap a wire lead therebetween. The other diagonally opposite pair of terminal openings has a pair of pin receptacle terminal/contacts 58 disposed therein. Terminal/contacts 58 have a U-shaped contact clip structure aligned with the opening to receive a pin terminal between the legs of the U-shaped clip. Each of the terminal/contacts 54 and 58 have a contact arm 54a and 58a, respectively, which projects radially inward toward a center hub of a rotor 60 on which a pair of trapezoidally shaped contact segments 62 and 64 are mounted. Referring particularly to FIG. 7, segment 62 bridges the terminal/contacts 54 and 58 at one side of the reversing switch 8 and contact segment 64 bridges the terminal/contacts 54 and 58 at the opposite side of reversing switch 8. Rotor 60 is rotatably driven by an eccentric pin 60a which projects through a slot (not shown) in the upper surface of the housing of switch 8 to be received in a slot 10b of lever 10 as seen in FIG. 2. Referring to FIG. 7, counterclockwise movement of rotor 60 through appropriate movement of lever 10 moves the narrow ends of the respective contact segments 62 and 64 out of engagement with the respective contact fingers 58a and moves the wider ends of the respective segments 62 and 64 into bridging engagement with the contact fingers 54a and 58a at respective opposite ends of reversing switch 8.

Insertion of the reversing switch 8 into the "pocket" formed by the various walls operates to plug one of the pin type receptacle terminal/contacts 58 onto the plated cylindrical projection 24b of conductive strip 24 to establish an electrical connection between the conductive strip 24 and the respective terminal of reversing switch 8. The other terminal opening on the side of reversing switch 8 adjacent or facing rear wall 4e has a press-in terminal/contact 54 which aligns with the opening 4t in housing rear wall 4e to permit the insertion of a wire lead through the opening 4t and respective opening in the reversing switch 8 to be push-in connected to the terminal 54.

Printed circuit board 14 forms a cover for the open side of housing 4, retaining the various assembled elements within the cavity of the housing 4. Although not specifically shown, the inwardly facing surface of printed circuit board 14 has a circuit printed thereon which, among other things, has a contact strip and a resistance strip 49 (FIG. 6) arranged in cooperative alignment with the wiper contact 48 to provide a potentiometer P (FIG. 10) whose resistance varies with the position of trigger operator 6. As seen in FIG. 2, the lower edge of printed circuit board 14 has a plurality of plated through holes 14a–14g which receive pin projections 18a–30a therein, respectively. The plated through holes are a part of appropriate traces and circuitry of the printed circuit. When circuit board 14 is in position on housing 4, a soldering operation is performed to mechanically and electrically bond each of the pins 18a-30a within the respective plated through holes 14a-14g, thereby connecting the conductive strips in housing 4 with the printed circuit on printed circuit board 14.

Printed circuit board 14 has a conductive pin 14h projecting from the inner surface thereof in alignment with the facing pin receptacle terminal/contact 58 of reversing switch 8 to make electrical contact therewith by being inserted into the terminal upon placement of board 14 to the housing 4. An opening 14j is provided in the opposite upper corner of printed circuit board 14 to align with the opening for push-in wire lead terminal/contact 54 on the facing side of reversing switch 8. A plated through hole 14k and a plated through hole slot 14m are provided on printed circuit board 14, although they are electrically isolated from any portion of the circuit printed on the board. Hole 14k receives projecting pin 4r therein and slot 14m receives projecting pin 4s therein. These respective pins are soldered within the respective plated through holes at the same time as the soldering is performed on the pins 18a-30a within plated through holes 14a-14g to provide an expedient method of mechanically bonding the printed circuit board to housing 4 at an upper portion of the board.

A speed control circuit usable in the trigger operated control of this invention is shown schematically in FIG. 10. The speed control circuit is a variable duty cycle circuit controlled by the potentiometer having its wiper contact 48 mechanically connected to the trigger operator 6. Wire leads from the negative and positive terminals of a battery B (FIG. 10) are connected to terminal holes 18b and 24c, respectively, preferably by soldering. However, it should be recognized that spade-type terminals could be provided on housing 4 at the locations of holes 18b and 24c and push-on wire lead terminals could be used, as well as numerous other common wire conductor termination methods. A positive signal from the battery B is applied through pin 24a to a trace on printed circuit board 14 through a current limit resistor R2 and a diode D1 to one side of the resistance strip of the potentiometer P, through the wiper 48 and a second resistor R3 and a capacitor C1 to the negative side of battery B through pin 20a, conductive strip 20, stationary contact 34, movable contact 50, stationary contact 32, and conductive strip 18 to form an RC timing circuit comprising the resistances R2, a portion of the potentiometer P and R3 and the capacitor C1. As the capacitor charges it applies a signal to pins 6 and 2 of a 555 integrated circuit timing chip 70 of well known construction. A charging signal at pins 6 and 2 of timing chip 70 provides a high signal at the square wave output pin 3 of the 555 timer which is connected to a capacitor C3. The opposite side of capacitor C3 is connected to the positive side of battery B through diode D3 to charge the capacitor C3 higher than the timer output at pin 3. Capacitor C3, diodes D4 and D6 and resistor R4 and diode D3 form a voltage doubler circuit and apply a higher than battery voltage to the gate 6 of FET 38 to drive the FET fully on, i.e. to make it fully conducting, thereby applying driving power to the motor M. When the capacitor C1 reaches a predetermined value, 555 timer circuit 70 establishes a short circuit discharge circuit therethrough from pins 7 to 1, thereby discharging capacitor C1 through resistor R3, the right-hand half of the potentiometer, resistor R1 and diode D2 through pin 7 and 1 to the negative side of battery B. Discharging of capacitor C1 changes the output at pin 3 of 555 timer 70 to zero or a negative voltage which brings the voltage to the gate G of FET 38 down to a fully off condition to remove power from the motor. The system is a pulse width modulation system for the control of the motor M wherein the motor speed is controlled by the amount of time that it is turned on or receives power as compared to the amount of time that it is off or receives no power. The time or duty cycle is varied by varying the charging rate of capacitor C1 through the setting of the potentiometer P as determined by the trigger operator 6. Resistor R2 is connected between pins 7 and 8 in the positive bus of the circuit to prevent a short circuit of the battery during discharge of capacitor C1. A diode D5 is connected from the drain terminal D of FET 38 to the positive bus to provide an energy dissipation path for the motor armature when power is removed therefrom. Capacitor C2 is connected from pin 5 of the 555 timer circuit 70 to the negative side of battery B to provide a noise filtering for the 555 timer circuit. Diodes D4 and D6 in series function to maintain the voltage applied to the gate G below the fully off voltage of the FET 38 during the time that pin 3 is low.

It should be recognized that the circuit described herein is one of several speed control circuits that could be utilized in this control, and is not to be considered a limiting feature to the invention. As mentioned hereinabove, the features and conductive strips provided on flange 4m are also capable of several variations according to customer requirements. The housing, conductive pattern and printed circuit board cover provide a unique control assembly of few discrete parts which is readily and economically manufactured. Although a preferred embodiment and best mode of the invention has been shown and described, it is to be understood that the control is susceptible of various modifications without departing from the scope of the appended claims.

What is claimed is:

1. A trigger operated electric control comprising an insulating housing comprising a plurality of contiguously arranged walls defining a cavity having an open side and a cover disposed over said open side, switch contacts and a potentiometer located in said cavity, a trigger operator located in part in said cavity and being operably connected to said switch contacts and said potentiometer, terminals connectable to a source of electric power, and a plurality of electrical conductors on surfaces of said walls, said conductors being electrically continuous between surfaces of contiguous said walls and said cover electrically interconnecting said switch contacts, potentiometer and terminals.

2. The trigger operated electric control defined in claim 1 wherein said insulating housing comprises a two-shot plastic molding and said conductors comprise conductive metal plated on exposed portions of material of one shot of said two-shot plastic molding.

3. The trigger operated electric control defined in claim 2 wherein said conductive metal is plated to a thickness adequate for conducting power currents of three amps or greater.

4. A trigger operated electric control assembly comprising:
an insulating housing comprising a plurality of contiguously arranged walls defining a cavity;

a trigger operator mounted for reciprocal movement on said housing and extending into said cavity;

a plurality of electrical conductors on a plurality of surfaces of said walls, said conductors being electrically continuous between adjacent said surfaces;

stationary circuit elements disposed within said cavity electrically connected to respective said conductors;

movable contact elements disposed in said cavity in cooperative relationship to said stationary circuit elements; and means connecting said trigger operator to said movable contact elements for movement of said movable contact elements with said trigger operator relative to said stationary contact elements.

5. The trigger operated electric control assembly defined in claim 4 further comprising a discrete insulating substrate having a printed circuit disposed on a surface thereof, said insulating substrate being attached to said housing with said surface being adjacent said cavity, wherein said stationary circuit elements comprise at least a conductive bus and a resistor strip on said printed circuit and said movable contact elements comprise at least a conductive wiper disposed in cooperating relationship to said bus and said resistor, said wiper being positioned along said bus and said resistor in response to movement of said trigger operator.

6. The trigger operated electric control assembly defined in claim 5 wherein respective said electrical conductors on a surface of said housing adjacent said substrate are electrically engaged by cooperatively aligned traces of said printed circuit upon attachment of said substrate to said housing.

7. The trigger operated electric control assembly defined in claim 6 further comprising a self-contained electric reversing switch and wherein said housing and said substrate define in part a pocket for retaining said reversing switch assembled to said housing, said reversing switch comprising a pair of wiring terminals for receiving wire conductor leads from an electric load controlled by said control assembly and a pair of pin receptacle terminals; said housing comprising a pin electrically continuous with a respective one of said electrical conductors, said pin projecting into one of said pin receptacle terminals in electrical engagement therewith; and said printed circuit on said substrate comprising a conductive pin projecting therefrom electrically connected to said printed circuit, said conductive pin projecting into an other one of said pair of pin receptacle terminals in electrical engagement therewith.

8. The trigger operated electric control assembly defined in claim 5 wherein said plurality of electrical conductors comprises conductors on exterior surfaces of said housing electrically connected with at least two of said conductors on said surfaces defining said cavity by respective said conductors on surfaces extending therebetween, at least two of said conductors on said exterior surfaces being electrically connectable to a source of electric power.

9. The trigger operated electric control assembly defined in claim 8 further comprising a semiconductor switching device having a plurality of terminal leads, and wherein said terminal leads are connectable to respective ones of said conductors on said exterior surfaces of said housing for mounting said semiconductor switching device exteriorly of said housing.

10. The trigger operated electric control assembly defined in claim 4 wherein said insulating housing comprises a two-shot plastic molding and said electrical conductors are disposed only on exposed portions of material of one shot of said two-shot plastic molding.

11. The trigger operated electric control assembly defined in claim 6 wherein said respective electrical conductors on said housing comprise conductive pins projecting from said surface of said housing and said traces of said printed circuit comprise plated through holes, said pins being disposed in said plated through holes with said substrate printed circuit surface disposed against said surface of said housing, said pins and said plated through holes being mechanically and electrically bonded together by soldering.

12. The trigger operated electric control assembly defined in claim 11 wherein said housing comprises additional conductive pins projecting from said surface of said housing, said additional pins being electrically isolated from said electrical conductors, and said substrate comprises additional plated through holes cooperatively aligned with said additional pins, said additional plated through holes being electrically isolated from said traces, said additional pins being disposed in said additional plated through holes with said substrate printed circuit surface disposed against said surface of said housing and being bonded together by soldering to mechanically secure said substrate to said housing.

13. Electric control apparatus comprising:

an insulating housing having walls defining in part a cavity;

stationary contact means disposed in said cavity;

movable contact means disposed in cooperative arrangement with said stationary contact means within said cavity;

operator means movably mounted on said housing and extending into said cavity;

means in said cavity coupling said movable contact means to said operator means;

terminal means located on said housing connectable to a source of electrical power; and a plurality of electrical conductors affixed to surfaces of said walls defining said cavity and to exterior surfaces of said housing and to surfaces extending between said cavity and said exterior surfaces of said housing, said conductors being electrically continuous between adjacent intersecting ones of said surfaces electrically connecting said stationary contact means to said terminal means.

14. The electric control apparatus defined in claim 13 wherein said housing comprises a plurality of discrete members each having said electrical conductors disposed thereon, at least one of said discrete members having said electrical conductors affixed to said adjacent intersecting surfaces, said electrical conductors on one of said discrete housing members having portions electrically engaged with cooperatively arranged portions of said electrical conductors on another of said discrete housing members upon assembly of said discrete housing members together.

15. The electric control apparatus defined in claim 14 wherein said portions of said conductors of respective said discrete housing members are conductively bonded together.

16. The electric control apparatus defined in claim 13 wherein said electrical conductors comprise conductors integrally fixed on interior surfaces of said housing walls adjacent said cavity, on exterior surfaces of said housing walls and on interconnecting surfaces extending between said interior and said exterior surfaces.

17. The electric control apparatus defined in claim 16 wherein said interconnecting surfaces comprise at least one surface defining respective passageways extending through said housing walls between said interior and said exterior surfaces.

18. The electric control apparatus defined in claim 13 wherein said housing comprises a molded base member having said cavity open to one side thereof and a discrete printed circuit board cover member attached to said one side of said base member, said cover closing said cavity, said intersecting surfaces comprising surfaces of said molded base member defining in part said cavity and said one side, said printed circuit board comprising conductive traces cooperatively engaging portions of said electrical conductors upon attachment of said cover to said base.

19. The electric control apparatus defined in claim 18 wherein said stationary contact means comprises contact elements mounted on said conductors within said cavity and said movable contact means comprise a movable contact element movable into and out of engagement with said stationary contact elements.

20. The electric control apparatus defined in claim 19 wherein said stationary contact means comprises a conductive strip and a resistor strip disposed on said traces of said printed circuit board and said movable contact means comprises a conductive wiper movable along said conductive strip and said resistor strip.

21. The electric control apparatus defined in claim 20 wherein said operator means comprises a reciprocally movable trigger operator extending through an opening in a wall of said housing.

22. An electrical control assembly comprising:
an insulating housing comprising a plurality of walls arranged in intersecting planes for defining a chamber in said housing;
an operating assembly located at least in part in said chamber;
power terminal means supported on said insulating housing and connectable to a source of power;
said insulating housing comprising a first portion formed from a first material and a second portion formed from a second material which is molded in situ to said first portion leaving surfaces of said first material exposed on said walls; and
conductor means plated on said exposed surfaces of said first portion of said insulating housing, said conductor means being electrically continuous between adjacent intersecting ones of said surfaces, connecting said power terminal means and said operating assembly to provide for energization of said operating assembly from said power terminal means and further providing a control path for directing a control signal from said operating assembly.

23. The electrical control assembly defined in claim 22 wherein said conductor means are disposed on an interior surface of said walls defining said chamber for engagement with said operating assembly disposed in said chamber.

24. The electrical control assembly defined in claim 22 wherein said operating assembly comprises:
an operator mounted to said insulating housing, said operator having a portion thereof extending from said chamber externally of said insulating housing; and
control means located within said chamber.

25. The electrical control assembly defined in claim 24 wherein said control means comprises switch means disposed in said chamber operably coupled to said operating assembly.

26. The electrical control assembly defined in claim 25 wherein said control means comprises variable power control means operably coupled to said operating assembly for providing predetermined power related to operator position.

27. The electrical control assembly defined in claim 26 wherein said variable power control means comprises a potentiometer mounted in said chamber having a movable wiper contact connected to said operating assembly.

28. The electrical control assembly defined in claim 27 wherein said switch means comprises a plurality of stationary contacts mounted on respective said conductor means on interior surfaces of said walls defining said chamber and a movable contact connected to said operating assembly for movement into and out of bridging engagement with said plurality of stationary contacts.

29. The electrical control assembly defined in claim 28 wherein said insulating housing comprises plated conductor means on exterior wall surfaces of said insulating housing, on interior wall surfaces of said insulating housing which define in part said chamber, and on wall surfaces communicating between said exterior and said interior wall surfaces.

30. The electrical control assembly defined in claim 29 wherein said control path comprises a projection integrally molded with said first portion of said insulating housing and projecting from an interior wall surface thereof, said projection having said conductor means plated thereon providing a pin-type terminal means for said control path.

31. The electrical control assembly defined in claim 30 further comprising a self-contained switch unit disposed in said chamber having at lest one plug-in terminal receiving said pin-type terminal.

32. The electrical control assembly defined in claim 31 wherein said insulating housing comprises an open side exposing said chamber and said control assembly further comprises a printed circuit board secured to said housing over said open side, said printed circuit board defining one interior surface of said chamber.

33. The electrical control assembly defined in claim 32 wherein said conductor means comprises pin projections at said open side of said housing and said printed circuit board comprises plated through holes corresponding with said pin projections and being part of respective traces on said printed circuit board, said pin projections being received within respective corresponding plated through holes when said printed circuit board is secured to said insulating housing.

34. The electrical control assembly defined in claim 32 wherein said insulating housing comprises at least one secondary molded pin projection of said first portion, said secondary molded pin projection being conductively plated and electrically isolated from said conductor means, and said printed circuit board comprises at least one secondary plated through hole receiving said secondary molded pin projection therein, said printed circuit board being secured to said insulating housing by soldering said pin projections and said secondary pin projections within said plated through holes and said secondary plated through holes, respectively.

* * * * *